(12) United States Patent
Sun

(10) Patent No.: US 10,676,819 B2
(45) Date of Patent: *Jun. 9, 2020

(54) NON-LINE OF SIGHT DEPOSITION OF ERBIUM BASED PLASMA RESISTANT CERAMIC COATING

(71) Applicant: Applied Materials, Inc., Santa Clara, CA (US)

(72) Inventor: Jennifer Y Sun, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 211 days.

This patent is subject to a terminal disclaimer.

(21) Appl. No.: 15/820,871

(22) Filed: Nov. 22, 2017

(65) Prior Publication Data

US 2018/0094348 A1    Apr. 5, 2018

Related U.S. Application Data

(62) Division of application No. 15/191,269, filed on Jun. 23, 2016, now Pat. No. 9,850,573.

(51) Int. Cl.
   *C23C 16/40* (2006.01)
   *C23C 16/44* (2006.01)
   (Continued)

(52) U.S. Cl.
   CPC .......... *C23C 16/40* (2013.01); *C23C 16/0227* (2013.01); *C23C 16/30* (2013.01);
   (Continued)

(58) Field of Classification Search
   CPC .............. C23C 16/40; C23C 16/45553; C23C 16/4404; C23C 16/30; C23C 16/403;
   (Continued)

(56) References Cited

U.S. PATENT DOCUMENTS 5,630,314 A    5/1997   Kojima et al.
5,646,425 A    7/1997   Beach
(Continued)

FOREIGN PATENT DOCUMENTS

CN    105225997 A    1/2016
JP    H03115535      5/1991
(Continued)

OTHER PUBLICATIONS

Putkonen, M. et al. "Low-Temperature ALE Deposition of Y2O3 Thin Films from β-Diketonate Precursors", Chemical Vapor Deposition, 2001, vol. 7, No. 1, pp. 44-50, Verlag GmbH, Weinheim, Germany.
(Continued)

*Primary Examiner* — Jeffrie R Lund
(74) *Attorney, Agent, or Firm* — Lowenstein Sandler LLP

(57) ABSTRACT

Described herein is a method of depositing a plasma resistant ceramic coating onto a surface of a chamber component using a non-line-of-sight (NLOS) deposition process, such as atomic layer deposition (ALD) and chemical vapor deposition (CVD). The plasma resistant ceramic coating consists of an erbium containing oxide, an erbium containing oxy-fluoride, or an erbium containing fluoride. Also described are chamber components having a plasma resistant ceramic coating of an erbium containing oxide, an erbium containing oxy-fluoride, or an erbium containing fluoride.

18 Claims, 7 Drawing Sheets

(51) Int. Cl.
*H01J 37/32* (2006.01)
*C23C 16/455* (2006.01)
*C23C 16/02* (2006.01)
*C23C 16/30* (2006.01)
*C23C 16/56* (2006.01)

(52) U.S. Cl.
CPC .......... *C23C 16/403* (2013.01); *C23C 16/405* (2013.01); *C23C 16/4404* (2013.01); *C23C 16/45525* (2013.01); *C23C 16/45553* (2013.01); *C23C 16/56* (2013.01); *H01J 37/32467* (2013.01); *H01J 37/32495* (2013.01)

(58) Field of Classification Search
CPC ............ C23C 16/405; C23C 16/45525; C23C 16/0227; C23C 16/56; H01J 37/32495; H01J 37/32467
See application file for complete search history.

(56) References Cited

U.S. PATENT DOCUMENTS

| | | | |
|---|---|---|---|
| 5,805,973 A | 9/1998 | Coffinberry et al. | |
| 5,840,434 A | 11/1998 | Kojima et al. | |
| 6,129,029 A | 10/2000 | Watson | |
| 6,139,983 A | 10/2000 | Ohashi et al. | |
| 6,432,256 B1 | 8/2002 | Raoux | |
| 6,548,424 B2 | 4/2003 | Putkonen | |
| 6,632,549 B1 | 10/2003 | Ohashi et al. | |
| 6,641,941 B2 | 11/2003 | Yamada et al. | |
| 6,685,991 B2 | 2/2004 | Wataya et al. | |
| 6,777,353 B2 | 8/2004 | Putkonen | |
| 6,835,417 B2 | 12/2004 | Saenger et al. | |
| 6,858,332 B2 | 2/2005 | Yamada | |
| 6,858,546 B2 | 2/2005 | Niinisto et al. | |
| 6,916,534 B2 | 7/2005 | Wataya et al. | |
| 7,138,192 B2 | 11/2006 | Yamada et al. | |
| 7,351,658 B2 | 4/2008 | Putkonen | |
| 7,384,696 B2 | 6/2008 | Hayasaki et al. | |
| 7,498,272 B2 | 3/2009 | Niinisto et al. | |
| 7,560,376 B2 | 7/2009 | Escher et al. | |
| 7,569,280 B2 | 8/2009 | Hayasaki et al. | |
| 7,696,117 B2 | 4/2010 | Sun et al. | |
| 7,732,067 B2 | 6/2010 | Zurbuchen | |
| 7,754,621 B2 | 7/2010 | Putkonen | |
| 7,780,786 B2 | 8/2010 | Mitsuhashi et al. | |
| 7,968,205 B2 | 6/2011 | Nakano et al. | |
| 7,998,883 B2 | 8/2011 | Putkonen | |
| 8,252,410 B2 | 8/2012 | Rasheed | |
| 8,367,227 B2 | 2/2013 | Sun et al. | |
| 8,399,862 B2 | 3/2013 | Ohmi et al. | |
| 8,619,406 B2 | 12/2013 | Cho et al. | |
| 8,758,858 B2 | 6/2014 | Sun et al. | |
| 8,858,745 B2 | 10/2014 | Sun et al. | |
| 8,871,312 B2 | 10/2014 | Sun et al. | |
| 8,916,021 B2 | 12/2014 | Sun et al. | |
| 9,012,030 B2 | 4/2015 | Han et al. | |
| 9,017,765 B2 | 4/2015 | Sun et al. | |
| 9,090,046 B2 | 7/2015 | Sun et al. | |
| 9,212,099 B2 | 12/2015 | Sun et al. | |
| 9,343,289 B2 | 5/2016 | Sun et al. | |
| 9,394,615 B2 | 7/2016 | Sun et al. | |
| 9,440,886 B2 | 9/2016 | Sun et al. | |
| 9,460,898 B2* | 10/2016 | Kim | H01J 37/32357 |
| 9,551,070 B2 | 1/2017 | Chang et al. | |
| 9,583,369 B2* | 2/2017 | Sun | C23C 4/11 |
| 9,617,188 B2 | 4/2017 | Sun et al. | |
| 9,617,633 B2 | 4/2017 | He et al. | |
| 9,633,884 B2 | 4/2017 | He et al. | |
| 9,850,573 B1* | 12/2017 | Sun | C23C 16/4404 |
| 10,186,400 B2* | 1/2019 | Wu | C23C 16/045 |
| 10,418,229 B2* | 9/2019 | Sun | C23C 24/04 |
| 10,443,125 B2* | 10/2019 | Wu | C23C 4/18 |
| 10,443,126 B1* | 10/2019 | Wu | C23C 16/40 |
| 10,468,235 B2* | 11/2019 | Sun | H01J 37/32495 |
| 10,501,843 B2* | 12/2019 | Sun | C23C 14/34 |
| 10,541,171 B2* | 1/2020 | Parkhe | H01L 21/68757 |
| 10,544,500 B2* | 1/2020 | Sun | C23C 14/0694 |
| 2002/0177001 A1 | 11/2002 | Harada et al. | |
| 2003/0029563 A1 | 2/2003 | Kaushal et al. | |
| 2003/0051811 A1 | 3/2003 | Uchimaru et al. | |
| 2004/0023811 A1 | 2/2004 | Iijima | |
| 2004/0099285 A1 | 5/2004 | Wang | |
| 2004/0136681 A1 | 7/2004 | Drewery et al. | |
| 2004/0151841 A1 | 8/2004 | Trickett et al. | |
| 2004/0197471 A1* | 10/2004 | Knowles | C23C 10/06 427/237 |
| 2005/0227118 A1 | 10/2005 | Uchimaru et al. | |
| 2006/0037536 A1 | 2/2006 | Kobayashi et al. | |
| 2006/0073354 A1 | 4/2006 | Watanabe et al. | |
| 2006/0196419 A1* | 9/2006 | Tudhope | C23C 16/0272 118/715 |
| 2007/0026246 A1 | 2/2007 | Harada et al. | |
| 2008/0032115 A1 | 2/2008 | Umeki et al. | |
| 2008/0048225 A1 | 2/2008 | Ahn et al. | |
| 2008/0066647 A1 | 3/2008 | Harada et al. | |
| 2008/0213496 A1 | 9/2008 | Sun et al. | |
| 2008/0264565 A1 | 10/2008 | Sun | |
| 2009/0194233 A1 | 8/2009 | Tamura et al. | |
| 2009/0302434 A1 | 12/2009 | Pallem | |
| 2010/0048028 A1 | 2/2010 | Rasheed et al. | |
| 2010/0119843 A1 | 5/2010 | Sun et al. | |
| 2010/0119844 A1* | 5/2010 | Sun | C03C 3/247 428/426 |
| 2010/0129670 A1 | 5/2010 | Sun et al. | |
| 2010/0219267 A1* | 9/2010 | Fu | G03F 7/00 239/589 |
| 2010/0243764 A1* | 9/2010 | Okesaku | B28B 3/2645 239/589 |
| 2010/0323124 A1 | 12/2010 | Vartabedian et al. | |
| 2011/0091700 A1 | 4/2011 | Simpson | |
| 2012/0135155 A1 | 5/2012 | Han et al. | |
| 2012/0138472 A1 | 6/2012 | Han et al. | |
| 2013/0154059 A1 | 6/2013 | Ohmi et al. | |
| 2013/0162142 A1* | 6/2013 | Nishino | H05H 1/46 315/111.21 |
| 2013/0162143 A1 | 6/2013 | Chen | |
| 2014/0116338 A1 | 5/2014 | He et al. | |
| 2014/0120312 A1 | 5/2014 | He | |
| 2014/0318575 A1* | 10/2014 | Parkhe | H01L 21/6831 134/1.1 |
| 2014/0318974 A1* | 10/2014 | Curran | C25D 11/02 205/50 |
| 2014/0334060 A1* | 11/2014 | Parkhe | H01L 21/67103 361/234 |
| 2014/0349073 A1 | 11/2014 | Sun et al. | |
| 2014/0377504 A1 | 12/2014 | Sun et al. | |
| 2015/0004418 A1 | 1/2015 | Sun et al. | |
| 2015/0021324 A1* | 1/2015 | Sun | C23C 4/11 220/200 |
| 2015/0024155 A1 | 1/2015 | Sun et al. | |
| 2015/0061237 A1 | 3/2015 | Sun et al. | |
| 2015/0064450 A1 | 3/2015 | Sun et al. | |
| 2015/0075714 A1* | 3/2015 | Sun | H01J 37/32477 156/345.1 |
| 2015/0133285 A1 | 5/2015 | Sun et al. | |
| 2015/0152540 A1 | 6/2015 | Sato et al. | |
| 2015/0158775 A1 | 6/2015 | Sun et al. | |
| 2015/0299050 A1 | 10/2015 | Sun et al. | |
| 2015/0307982 A1 | 10/2015 | Firouzdor et al. | |
| 2015/0311043 A1* | 10/2015 | Sun | C23C 14/221 428/335 |
| 2015/0311044 A1* | 10/2015 | Sun | C23C 14/081 428/139 |
| 2015/0321964 A1* | 11/2015 | Sun | C04B 35/10 428/143 |
| 2015/0329955 A1 | 11/2015 | Sun et al. | |
| 2015/0376780 A1 | 12/2015 | Khaja et al. | |
| 2016/0042924 A1* | 2/2016 | Kim | H01J 37/32357 313/231.31 |
| 2016/0079040 A1 | 3/2016 | Park et al. | |
| 2016/0181627 A1 | 6/2016 | Roeder et al. | |
| 2016/0211121 A1 | 7/2016 | Sun et al. | |

(56) References Cited

U.S. PATENT DOCUMENTS

| | | | |
|---|---|---|---|
| 2016/0273095 A1 | 9/2016 | Lin et al. | |
| 2016/0312351 A1 | 10/2016 | Liu et al. | |
| 2016/0326625 A1 | 11/2016 | Sun et al. | |
| 2016/0326626 A1 | 11/2016 | Sun et al. | |
| 2016/0336210 A1 | 11/2016 | Cooke et al. | |
| 2016/0358749 A1* | 12/2016 | Sant | H01J 37/3211 |
| 2016/0375515 A1 | 12/2016 | Xu et al. | |
| 2016/0379806 A1 | 12/2016 | Xu et al. | |
| 2017/0022595 A1 | 1/2017 | Sato et al. | |
| 2017/0040146 A1 | 2/2017 | Huang et al. | |
| 2017/0110293 A1 | 4/2017 | Sun et al. | |
| 2017/0140969 A1 | 5/2017 | Kuo et al. | |
| 2017/0260616 A1* | 9/2017 | Lee | C23C 4/04 |
| 2017/0291856 A1* | 10/2017 | Sun | C04B 35/505 |
| 2017/0314125 A1* | 11/2017 | Fenwick | C23C 16/4404 |
| 2017/0369993 A1* | 12/2017 | Sun | C23C 16/4404 |
| 2018/0016678 A1* | 1/2018 | Fenwick | C23C 16/405 |
| 2018/0044800 A1 | 2/2018 | Hendrix et al. | |
| 2018/0094348 A1* | 4/2018 | Sun | C23C 16/4404 |
| 2018/0105932 A1* | 4/2018 | Fenwick | C23C 16/4404 |
| 2018/0108517 A1* | 4/2018 | Sun | H01J 37/32477 |
| 2018/0112311 A1* | 4/2018 | Fenwick | C23C 16/405 |
| 2018/0135157 A1* | 5/2018 | Jeong | C23C 4/123 |
| 2018/0209042 A1* | 7/2018 | Wu | C23C 16/045 |
| 2018/0240648 A1* | 8/2018 | Wu | C23C 16/045 |
| 2018/0265973 A1* | 9/2018 | Firouzdor | C23C 16/045 |
| 2018/0327892 A1* | 11/2018 | Wu | C23C 16/28 |
| 2018/0327898 A1* | 11/2018 | Wu | C23C 16/28 |
| 2018/0327899 A1* | 11/2018 | Wu | C23C 16/28 |
| 2018/0330923 A1* | 11/2018 | Tran | H01J 37/32495 |
| 2018/0337026 A1* | 11/2018 | Firouzdor | H01J 37/32715 |
| 2019/0078199 A1* | 3/2019 | Wu | C23C 16/45525 |
| 2019/0127280 A1* | 5/2019 | Zhan | C23C 16/45555 |
| 2019/0135704 A1* | 5/2019 | Gangakhedkar | C04B 35/50 |
| 2019/0136372 A1* | 5/2019 | Zhan | C23C 16/303 |
| 2019/0164767 A1* | 5/2019 | Hong | H01L 21/28264 |
| 2019/0263722 A1* | 8/2019 | Sun | C23C 16/405 |
| 2019/0271076 A1* | 9/2019 | Fenwick | C23C 16/4408 |
| 2019/0279893 A1* | 9/2019 | Parkhe | H01L 21/67103 |
| 2019/0309413 A1* | 10/2019 | Wu | H01L 21/0228 |
| 2019/0338418 A1* | 11/2019 | Goradia | H01J 37/32477 |
| 2019/0341289 A1* | 11/2019 | Parkhe | H01L 21/6831 |
| 2019/0382880 A1* | 12/2019 | He | C23C 14/046 |
| 2019/0382888 A1* | 12/2019 | Wu | C23C 16/405 |
| 2020/0024194 A1* | 1/2020 | Wu | C09D 1/00 |
| 2020/0024735 A1* | 1/2020 | Wu | C23C 16/30 |
| 2020/0035463 A1* | 1/2020 | Sun | C23C 4/18 |

FOREIGN PATENT DOCUMENTS

| | | |
|---|---|---|
| JP | 2002-306957 A | 10/2002 |
| JP | 2004-241203 A | 8/2004 |
| JP | 2006-082474 | 3/2006 |
| JP | 2006-144123 A | 6/2006 |
| JP | 2007-131951 | 5/2007 |
| JP | 2007-217782 | 8/2007 |
| KR | 20170044396 | 4/2017 |
| WO | WO 2007-013184 A1 | 2/2007 |
| WO | 2013032260 | 3/2013 |
| WO | 2015-120265 | 8/2015 |

OTHER PUBLICATIONS

Pilvi, T. et al. "ALD of YF3 Thin Films from TiF4 and Y(thd)3 Precursors", Chemical Vapor Deposition, 2009, vol. 15, pp. 27-32, Verlag GmbH & Co., Weinheim, Germany.

International Search Report and Written Opinion of the International Searching Authority for International Application No. PCT/US2017/014617 dated May 8, 2017.

Tamm, Aile et al. Atomic layer deposition and characterization of zirconium oxide-erbium oxide nanolaminates. Thin Solid Finls 519 (2010) 666-673.

Ronn, J., "Fabrication and characterization of atomic-layer-deposited Er2O3 for optical amplifier devices", Master Thesis for Aallo University School of Electrical Engineering, Dec. 1, 2014, 71 pages, Espoo, Finland.

Johansson, P., et al. "Atomic Layer Deposition Process for Barrier Applications of Flexible Packaging", Presentation for TAPPI Conference, Apr. 18-21, 2010, 33 pages, Albuquerque, New Mexico.

Rowland, J.C. "Atomic Layer Depositions of the Al2O3—Y2O3 Pseudo-Binary System", Doctoral Disertation, University of Florida, ProQuest LLC, 2010, pp. 1-106.

* cited by examiner

NON-LINE OF SIGHT DEPOSITION OF ERBIUM BASED PLASMA RESISTANT CERAMIC COATING

RELATED APPLICATIONS

This present application is a divisional of U.S. patent application Ser. No. 15/191,269, filed Jun. 23, 2016, the entire contents of which are hereby incorporated by reference herein.

TECHNICAL FIELD

Embodiments of the present disclosure relate to methods of coating chamber components with an erbium containing ceramic coating using non-line of sight deposition (NLOS) techniques.

BACKGROUND

Various manufacturing processes expose semiconductor process chamber components to high temperatures, high energy plasma, a mixture of corrosive gases, high stress, and combinations thereof. These extreme conditions may erode and/or corrode the chamber components, increasing the chamber components' susceptibility to defects. It is desirable to reduce these defects and improve the components' erosion and/or corrosion resistance in such extreme environments.

Protective coatings are typically deposited on chamber components by a variety of methods, such as thermal spray, sputtering, or evaporation techniques. In these techniques, the surfaces of the chamber components that are not directly exposed to the coating material source (e.g., are not in a line of sight of a material source) are coated with a significantly thinner coating than surfaces that are directly exposed to the coating material source. This may result in poor quality film, a low-density film, or a portion of the chamber component not being coated at all.

Some materials are more resistant to erosion and/or corrosion from particular hostile environments than others.

SUMMARY

Some of the embodiments described herein cover a method of using an erbium containing oxide, an erbium containing oxy-fluoride, or an erbium containing fluoride in order to create a plasma resistant ceramic coating on chamber components through a non-line of sight (NLOS) method of deposition. These NLOS methods that may be used are Chemical Vapor Deposition (CVD) and Atomic Layer Deposition (ALD) in embodiments.

In some embodiments, a chamber component includes a portion having an aspect ratio between 10:1 and 200:1. The chamber component additionally includes a plasma resistant ceramic coating on a surface of the portion the chamber component. The plasma resistant ceramic coating consists of an erbium containing oxide, an erbium containing oxy-fluoride, or an erbium containing fluoride. The plasma resistant ceramic coating has an approximately zero porosity and has a uniform thickness with a thickness variation of less than +/−5%.

In some embodiments, a chamber component includes a portion having an aspect ratio between 10:1 and 200:1. The chamber component additionally includes a plasma resistant ceramic coating on a surface of the portion the chamber component. The plasma resistant ceramic coating consists of $Er_2O_3$. The plasma resistant ceramic coating has an approximately zero porosity and has a uniform thickness with a thickness variation of less than +/−5%.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
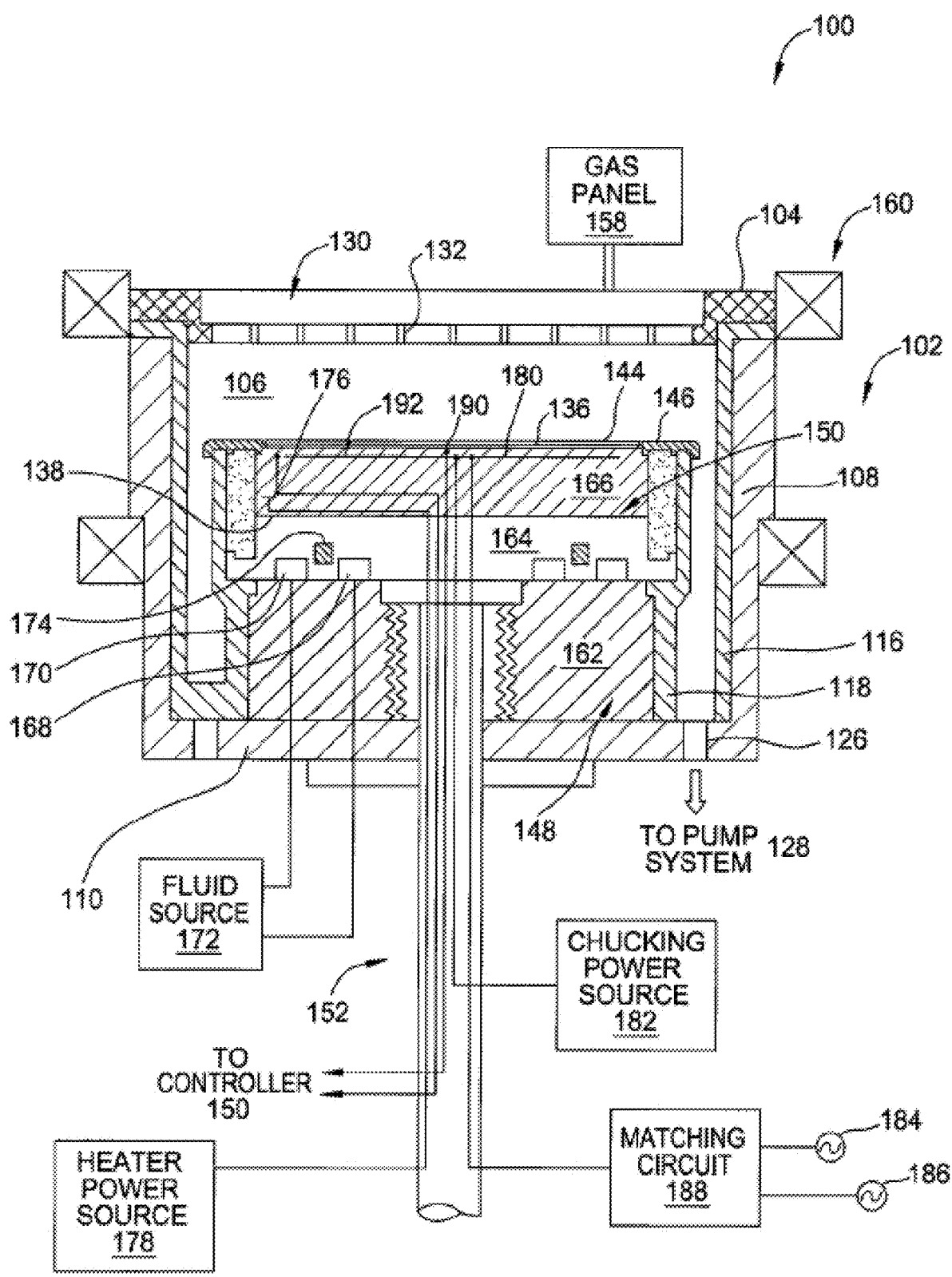
FIG. 1 depicts a sectional view of one embodiment of a processing chamber.

The embodiments described herein cover methods for depositing an erbium based plasma resistant ceramic coating containing an erbium based oxide, an erbium based fluoride, or an erbium based oxy-fluoride onto a chamber component or other article using non-line of sight (NLOS) deposition processes. The NLOS deposition process may be chemical vapor deposition (CVD) or atomic layer deposition (ALD), also known as atomic layer epitaxy, atomic monolayer epitaxy, and atomic layer chemical vapor deposition. The plasma resistant coating may be comprised of a multi-layer stack in come embodiments. The multi-layer stack may include an erbium containing oxide or an erbium containing fluoride as one layer, a different oxide or fluoride material as another layer, and one or more additional layers of $Er_2O_3$, $ErF_3$, $Al_2O_3$, $YF_3$, $Y_2O_3$ or $ZrO_2$. The sequence of layers may be repeated until desired thickness is achieved. This multi-layer stack may be annealed in order to create one, or more than one, interdiffused solid state phase between the first layer, the second layer and any additional layers. The interdiffused multi-layer stack may be a homogenous or approximately homogenous coating that includes the constituent materials of the different layers.

Embodiments described herein enable high aspect ratio features of chamber components and other articles to be effectively coated with plasma resistant ceramic coatings of erbium containing oxides, erbium containing fluorides and erbium containing oxy-fluorides. The plasma resistant ceramic coatings are conformal (e.g., with a thickness variation of less than about +/−5%) and very dense (e.g., with a porosity of 0% or approximately 0%). The plasma resistant ceramic coatings of the erbium containing oxides, the erbium containing fluorides and the erbium containing oxy-fluorides may be particularly resistant to corrosion and erosion from particular plasma etch chemistries, such as $CCl_4/CHF_3$ plasma etch chemistries.

CVD allows for conformal deposition of material on an article surface. A volatile precursor or mixture of precursors is flowed through a processing chamber at a steady rate. The precursor(s) will react within the chamber in a manner that deposits a desired product on to the article surface. The amount of material deposited is a function of deposition time. The longer the deposition time, the thicker the resultant film. Often other by-products of the chemical reaction will be created as well; these are removed by the gas flow through the chamber. The CVD process can be at a range of pressures from atmospheric to low pressure (i.e.: ~$10^{-8}$ Torr).

ALD allows for a controlled self-limiting deposition of material through chemical reactions with the surface of the article. Aside from being a conformal process, ALD is also a uniform process. All exposed sides of the article will have the same or approximately the same amount of material deposited. A typical reaction cycle of an ALD process starts with a precursor flooded into an ALD chamber. The precursor is then flushed out of the ALD chamber before a second precursor is introduced into the ALD chamber and subsequently flushed out. The reaction of the article surface and the chemical precursors creates a chemically bonded layer that is one atomic layer thick. Excess material that may be created by the process is flushed out. Unlike CVD, the thickness of material grown using ALD is not dependent on deposition time. For ALD the final thickness of material is dependent on the number of reaction cycles that are run, because each reaction cycle will grow a layer that is one atomic layer thick.

Process chamber components, such as shower heads, nozzles, diffusers and gas lines, would benefit from having these plasma resistant erbium containing ceramic coatings to protect them in harsh etch environments. Many of these chamber components have aspect ratios that range between 10:1 and 200:1, which makes them difficult to coat well using conventional line of slight deposition methods. Embodiments described herein enable high aspect ratio articles such as the aforementioned process chamber components to be coated with plasma resistant ceramic coatings that protect the articles. For example, embodiments enable the insides of gas lines, the insides of nozzles, the insides of holes in showerheads, and so on to be coated with an erbium containing ceramic coating.

FIG. 1 is a sectional view of a semiconductor processing chamber 100 having one or more chamber components that are coated with a plasma resistant ceramic coating that is an erbium oxide based coating, an erbium fluoride based coating or an erbium oxy-fluoride based coating in accordance with embodiments of the present invention. The processing chamber 100 may be used for processes in which a corrosive plasma environment having plasma processing conditions is provided. For example, the processing chamber 100 may be a chamber for a plasma etcher or plasma etch reactor, a plasma cleaner, and so forth. Examples of chamber components that may include the plasma resistant ceramic coating include chamber components with complex shapes and holes having large aspect ratios. Some exemplary chamber components include a substrate support assembly 148, an electrostatic chuck (ESC) 150, a ring (e.g., a process kit ring or single ring), a chamber wall, a base, a gas distribution plate, a showerhead of a processing chamber, gas lines, a nozzle, a lid, a liner, a liner kit, a shield, a plasma screen, a flow equalizer, a cooling base, a chamber viewport, a chamber lid, and so on. The plasma resistant ceramic coating, which is described in greater detail below, is applied using non-line of sight (NLOS) deposition processes such as ALD and CVD. ALD allows for the application of a conformal coating of a substantially uniform thickness on all types of components including components with complex shapes and holes with large aspect ratios. Similarly, CVD also allows for application of a conformal coating of a relatively uniform thickness.

The plasma resistant ceramic coating may be grown or deposited using ALD or CVD with various erbium containing ceramics such as ceramics including erbium oxide ($Er_2O_3$), erbium fluoride ($ErF_3$), and/or erbium oxy-fluoride ($Er_xO_yF_z$). The erbium containing ceramics may also include amounts of zirconium, yttrium, and/or aluminum. For example, the erbium containing ceramics may include zirconium oxide ($ZrO_2$), aluminum oxide ($Al_2O_3$), yttrium oxide ($Y_2O_3$), zirconium fluoride ($ZrF_4$), aluminum fluoride ($AlF_3$) and/or yttrium fluoride ($YF_3$). The erbium containing ceramic may be, for example, $Er_xO_yF_z$, $Er_xAl_yO_z$ (e.g., $Er_3Al_5O_{12}$), $Er_xZr_yO_z$, $Er_aZr_xAl_yO_z$, $Y_xEr_yO_z$, $Y_xEr_yF_z$, $Y_wEr_xO_yF_z$, or $Er_wY_xZr_yO_z$.

As illustrated, the substrate support assembly 148 has an erbium based plasma resistant ceramic coating 136, in accordance with one embodiment. However, it should be understood that any of the other chamber components, such as showerheads, gas lines, electrostatic chucks, nozzles and others, may also be coated with a multi-component coating.

In one embodiment, the processing chamber 100 includes a chamber body 102 and a showerhead 130 that enclose an interior volume 106. The showerhead 130 may include a showerhead base and a showerhead gas distribution plate. Alternatively, the showerhead 130 may be replaced by a lid and a nozzle in some embodiments. The chamber body 102 may be fabricated from aluminum, stainless steel or other suitable material. The chamber body 102 generally includes sidewalls 108 and a bottom 110. Any of the showerhead 130 (or lid and/or nozzle), sidewalls 108 and/or bottom 110 may include the erbium based plasma resistant ceramic coating.

An outer liner 116 may be disposed adjacent the sidewalls 108 to protect the chamber body 102. The outer liner 116 may be fabricated and/or coated with a multi-component coating. In one embodiment, the outer liner 116 is fabricated from aluminum oxide.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewall 108 of the chamber body 102. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 may be used for processing chambers used for dielectric etch (etching of dielectric materials). The showerhead 130 includes a gas distribution plate (GDP) 133 having multiple gas delivery holes 132 throughout the GDP 133. The showerhead 130 may include the GDP 133 bonded to an aluminum base or an anodized aluminum base. The GDP 133 may be made from Si or SiC, or may be a ceramic such as $Y_2O_3$, $Al_2O_3$, $Y_3Al_5O_{12}$ (YAG), and so forth. Showerhead 130 and delivery holes 132 may be coated with a erbium based plasma resistant ceramic coating as described in more detail below with respect to FIGS. 5A and 5B.

For processing chambers used for conductor etch (etching of conductive materials), a lid may be used rather than a showerhead. The lid may include a center nozzle that fits into a center hole of the lid. The lid may be a ceramic such as $A_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$. The lid, showerhead base 104, GDP 133 and/or nozzle may all be coated with a plasma resistant ceramic coating according to an embodiment.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). The substrate support assembly 148 is disposed in the interior volume 106 of the processing chamber 100 below the showerhead 130 or lid. The substrate support assembly 148 holds the substrate 144 during processing. A ring 146 (e.g., a single ring) may cover a portion of the electrostatic chuck 150, and may protect the covered portion from exposure to plasma during processing. The ring 146 may be silicon or quartz in one embodiment.

An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116. Additionally, the inner liner 118 may also be coated with a erbium based plasma resistant ceramic coating as described herein.

In one embodiment, the substrate support assembly 148 includes a mounting plate 162 supporting a pedestal 152, and an electrostatic chuck 150. The electrostatic chuck 150 further includes a thermally conductive base 164 and an electrostatic puck 166 bonded to the thermally conductive base by a bond 138, which may be a silicone bond in one embodiment. An upper surface of the electrostatic puck 166 may be covered by the erbium based plasma resistant ceramic coating 136 in the illustrated embodiment. The erbium based plasma resistant ceramic coating 136 may be disposed on the entire exposed surface of the electrostatic chuck 150 including the outer and side periphery of the thermally conductive base 164 and the electrostatic puck 166 as well as any other geometrically complex parts or holes having large aspect ratios in the electrostatic chuck. The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolators 174 and/or conduits 168, 170 to control a lateral temperature profile of the substrate support assembly 148. The conduits 168, 170 may be fluidly coupled to a fluid source 172 that circulates a temperature regulating fluid through the conduits 168, 170. The embedded isolator 174 may be disposed between the conduits 168, 170 in one embodiment. The heater 176 is regulated by a heater power source 178. The conduits 168, 170 and heater 176 may be utilized to control the temperature of the thermally conductive base 164. The conduits and heater heat and/or cool the electrostatic puck 166 and a substrate (e.g., a wafer) 144 being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features that may be formed in an upper surface of the puck 166. These surface features may all be coated with a erbium based plasma resistant ceramic coating according to an embodiment. The gas passages may be fluidly coupled to a source of a heat transfer (or backside) gas such as He via holes drilled in the electrostatic puck 166. In operation, the backside gas may be provided at controlled pressure into the gas passages to enhance the heat transfer between the electrostatic puck 166 and the substrate 144.

The electrostatic puck 166 includes at least one clamping electrode 180 controlled by a chucking power source 182. The clamping electrode 180 (or other electrode disposed in the electrostatic puck 166 or base 164) may further be coupled to one or more RF power sources 184, 186 through a matching circuit 188 for maintaining a plasma formed from process and/or other gases within the processing chamber 100. The RF power sources 184, 186 are generally capable of producing RF signal having a frequency from about 50 kHz to about 3 GHz and a power of up to about 10,000 Watts.

Figure 2:
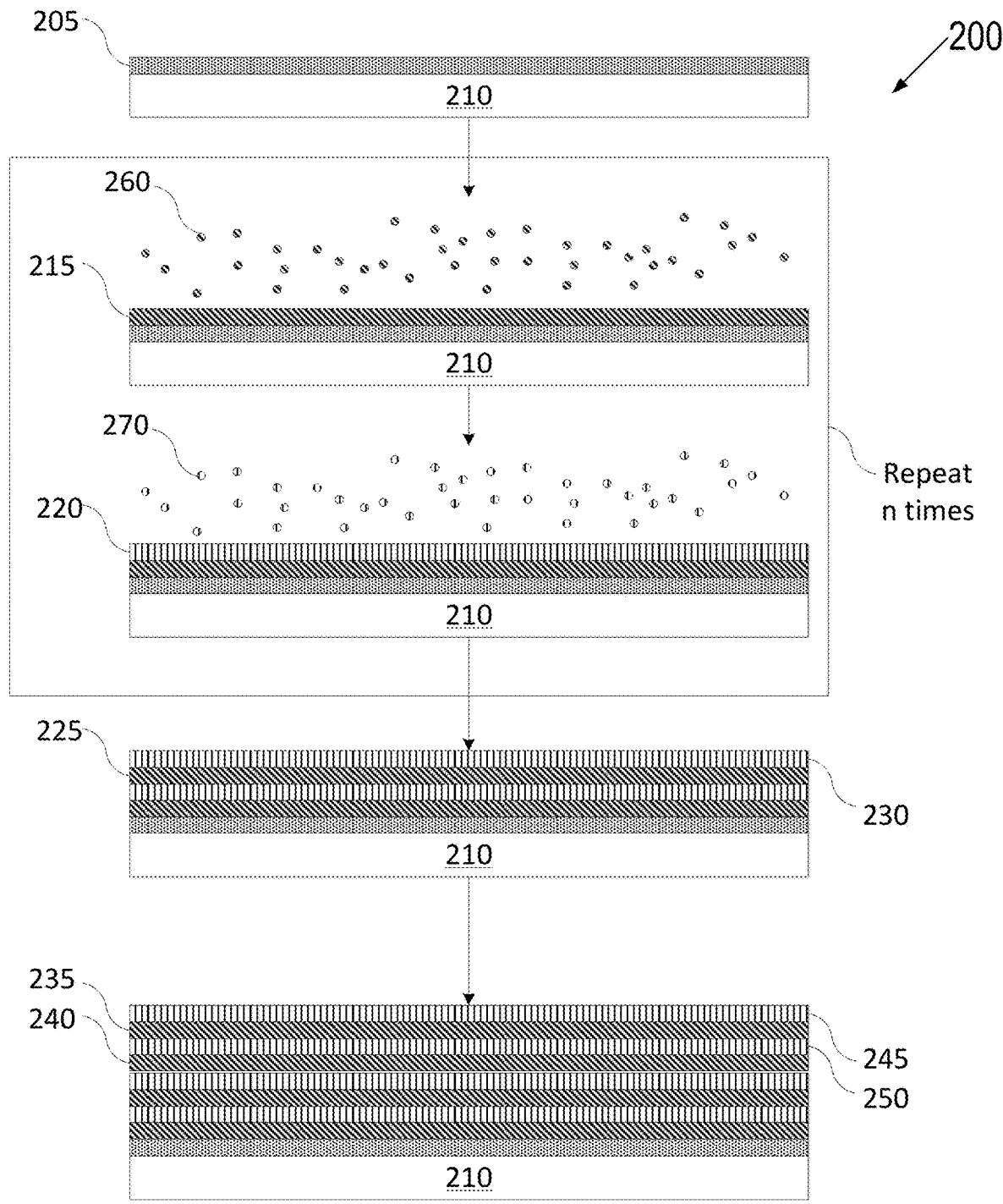
FIG. 2 depicts a deposition process in accordance with a variety of atomic layer deposition techniques and chemical vapor deposition techniques, in accordance with embodiments.

FIG. 2 depicts a deposition process in accordance with a variety of ALD and CVD techniques to grow or deposit a erbium based plasma resistant ceramic coating on an article. Various types of ALD processes exist and the specific type may be selected based on several factors such as the surface to be coated, the coating material, chemical interaction between the surface and the coating material, etc. The general principle for the various ALD processes comprises growing a thin film layer by repeatedly exposing the surface to be coated to sequential alternating pulses of gaseous chemical precursors that chemically react with the surface one at a time in a self-limiting manner.

Similarly, various types of CVD processes exist and the specific type may be selected based on several factors such as the surface to be coated, the coating material, chemical interaction between the surface and the coating material, desired thickness, desired coating properties, etc. Some examples of CVD processes include atmospheric CVD (APCVD), low pressures CVD (LPCVD), plasma enhanced CVD (PECVD), vapor phase epitaxy, and so on. Any of these CVD processes that are NLOS processes may be used in embodiments. For the various CVD processes, an article is exposed to one or more volatile precursors, which react and/or decompose on the article surface to produce a desired coating. Byproducts may be produced, which are removed by evacuating the byproducts from the deposition chamber in which the CVD process is performed.

FIG. 2 illustrates an article 210 having a surface 205. Article 210 may represent various process chamber components (e.g., semiconductor process chamber components) including but not limited to a substrate support assembly, an electrostatic chuck (ESC), a ring (e.g., a process kit ring or single ring), a chamber wall, a base, a gas distribution plate, gas lines, a showerhead, a nozzle, a lid, a liner, a liner kit, a shield, a plasma screen, a flow equalizer, a cooling base, a chamber viewport, a chamber lid, a diffuser, and so on. Article 210 may also be a portion of a battery or any conductive article. The article 210 and surface 205 may be made from a metal (such as aluminum, stainless steel), a ceramic, a metal-ceramic composite, a polymer, a polymer ceramic composite, mylar, polyester, or other suitable materials, and may further comprise materials such as AlN, Si, SiC, $Al_2O_3$, $SiO_2$, and so on.

For ALD, each individual chemical reaction between a precursor and the surface may be referred to as a "half-reaction." During each half reaction, a precursor is pulsed onto the surface for a period of time sufficient to allow the precursor to fully react with the surface. The reaction is self-limiting as the precursor will react with a finite number of available reactive sites on the surface, forming a uniform continuous film layer on the surface. Any sites that have already reacted with a precursor will become unavailable for further reaction with the same precursor unless and/or until the reacted sites are subjected to a treatment that will form new reactive sites on the uniform continuous coating. Exemplary treatments may be plasma treatment, treatment by exposing the uniform continuous film layer to radicals, or introduction of a different precursor able to react with the most recent uniform continuous film layer grown on the surface.

In FIG. 2, article 210 having surface 205 may be introduced to a first precursor 260 for a first duration until a layer 215 is fully grown or deposited (the terms grown and deposited may be used interchangeably herein) using ALD or CVD. Layer 215 may be uniform, continuous and conformal. The layer 215 may also have a very low porosity of less than 1% in embodiments, and less than 0.1% in further embodiments. In some embodiments the porosity is 0% or approximately 0%. Layer 215 may have a thickness of one atom or a few atoms (e.g., 2-3 atoms) in some embodiments in which ALD is used to form the layer 215. Layer 215 may have a thickness of about 1-100 nm if CVD is used.

Layer 215 may be $Er_2O_3$, $ErF_3$, $Y_2O_3$, $Al_2O_3$, $YF_3$, or $ZrO_2$ in embodiments. In some embodiments, layer 215 is a multi-component material of $Er_xO_yF_z$, $Er_xAl_yO_z$ (e.g., $Er_3Al_5O_{12}$), $Er_xZr_yO_z$, $Er_aZr_xAl_yO_z$, $Y_xEr_yO_z$, $Y_xEr_yF_z$, $Y_wEr_xO_yF_z$, or $Er_aY_xZr_yO_z$ (e.g., a single phase solid solution of $Y_2O_3$, $ZrO_2$ and $Er_2O_3$). Layer 215 may also be one of AlN, SiC, $Y_3Al_5O_{12}$ (YAG), $Y_4Al_2O_9$ (YAM), $TiO_2$, $Y_2O_3$ stabilized $ZrO_2$ (YSZ), or a ceramic compound comprising $Y_4Al_2O_9$ and a solid-solution of $Y_2O_3$—$ZrO_2$.

Subsequently, article 210 having surface 205 and layer 215 may be introduced to a second precursor 270 for a second duration until a second layer 220 is fully grown or deposited over layer 215 using ALD or CVD. The second layer 220 may be uniform, continuous and conformal. The second layer 220 may also have a very low porosity of less than 1% in embodiments, and less than 0.1% in further embodiments, and 0% or approximately 0% in still further embodiments. Second layer 220 may have a thickness of one atom or a few atoms (e.g., 2-3 atoms) in some embodiments in which ALD is used to form the second layer 220. Second layer 220 may have a thickness of about 1-100 nm if CVD is used.

Second layer 220 may be $Er_2O_3$, $ErF_3$, $Y_2O_3$, $Al_2O_3$, $YF_3$, or $ZrO_2$ in embodiments. In some embodiments, second layer 220 is a multi-component material of $Er_xO_yF_z$, $Er_xAl_yO_z$ (e.g., $Er_3Al_5O_{12}$), $Er_xZr_yO_z$, $Er_aZr_xAl_yO_z$, $Y_xEr_yO_z$, $Y_xEr_yF_z$, $Y_wEr_xO_yF_z$, or $Er_aY_xZr_yO_z$ (e.g., a single phase solid solution of $Y_2O_3$, $ZrO_2$ and $Er_2O_3$). Second layer 220 may also be one of AlN, SiC, $Y_3Al_5O_{12}$ (YAG), $Y_4Al_2O_9$ (YAM), $TiO_2$, $Y_2O_3$ stabilized $ZrO_2$ (YSZ), or a ceramic compound comprising $Y_4Al_2O_9$ and a solid-solution of $Y_2O_3$—$ZrO_2$. In one embodiment, at least one of the first layer or the second layer is an erbium containing compound (e.g., $Er_2O_3$, $ErF_3$, $Er_xO_yF_z$, $Er_xAl_yO_z$, $Er_xZr_yO_z$, $Er_aZr_xAl_yO_z$, $Y_xEr_yO_z$, $Y_xEr_yF_z$, $Y_wEr_xO_yF_z$, or $Er_aY_xZr_yO_z$). Accordingly, layer 215 may be an intermediate layer that is deposited prior to deposition of the erbium containing layer. Alternatively, second layer 220 may be a capping layer that is deposited over the erbium containing layer. In one embodiment, second layer 220 has a same composition as layer 215.

Thereafter, precursors 260 and 270 may be repeatedly introduced sequentially to grow or deposit additional alternating layers 225, 230, 235, 240, 245, and 250. Sequentially introducing the various precursors may be repeated N times, where N represents a finite number of layers selected based on the targeted coating thickness and properties. The various layers may remain intact or in some embodiments may be interdiffused.

The surface reactions (e.g., half-reactions) are done sequentially, and the various precursors are not in contact in embodiments. Prior to introduction of a new precursor, the chamber in which the ALD or CVD process takes place may be purged with an inert carrier gas (such as nitrogen or air) to remove any unreacted precursor and/or surface-precursor reaction byproducts. Depending on which ALD or CVD process is used, the precursors may be different or the same. In some embodiments, at least one precursor is used. In other embodiments, at least two precursors are used. In some embodiments, different precursors may be used to grow or deposit film layers having the same composition (e.g., to grow multiple layers of $Er_2O_3$ on top of each other). In other embodiments, different precursors may be used to grow different film layers having different compositions.

ALD or CVD processes may be conducted at various temperatures depending on the type of ALD or CVD process. The optimal temperature range for a particular ALD process is referred to as the "ALD temperature window." Temperatures below the ALD temperature window may result in poor growth rates and non-ALD type deposition. Temperatures above the ALD temperature window may result in thermal decomposition of the article or rapid desorption of the precursor. The ALD temperature window may range from about 200° C. to about 400° C. In some embodiments, the ALD temperature window is between about 200-350° C.

The ALD process and CVD process allow for a conformal erbium based plasma resistant ceramic coating having uniform thickness on articles and surfaces having complex geometric shapes, holes with large aspect ratios, and three-dimensional structures. Sufficient exposure time of the precursor to the surface enables the precursor to disperse and fully react with the surface in its entirety, including all of its three-dimensional complex features. The exposure time utilized to obtain conformal ALD in high aspect ratio structures is proportionate to the square of the aspect ratio and can be predicted using modeling techniques. Additionally, the ALD technique is advantageous over other commonly used coating techniques because it allows in-situ on demand material synthesis of a particular composition or formulation without the need for a lengthy and difficult fabrication of source materials (such as powder feedstock and sintered targets). ALD may be better able than CVD to coat articles with high aspect ratios. Accordingly, in some embodiments ALD is used to coat articles having aspect ratios of about 50:1 and higher (e.g., 200:1).

With the ALD technique, multi-component films such as $Er_xO_yF_z$, $Er_xAl_yO_z$ (e.g., $Er_3Al_5O_{12}$), $Er_xZr_yO_z$, and $Er_aZr_xAl_yO_z$, $Y_xEr_yO_z$, $Y_xEr_yF_z$, $Y_wEr_xO_yF_z$, and $Er_aY_xZr_yO_z$ (e.g., a single phase solid solution of $Y_2O_3$, $ZrO_2$ and $Er_2O_3$) can be grown or deposited, for example, by proper sequencing of the precursors used to grow $Er_2O_3$, $ErF_3$, $Y_2O_3$, $Al_2O_3$, $YF_3$, and $ZrO_2$, as illustrated in more detail in the examples below.

Figure 3A:
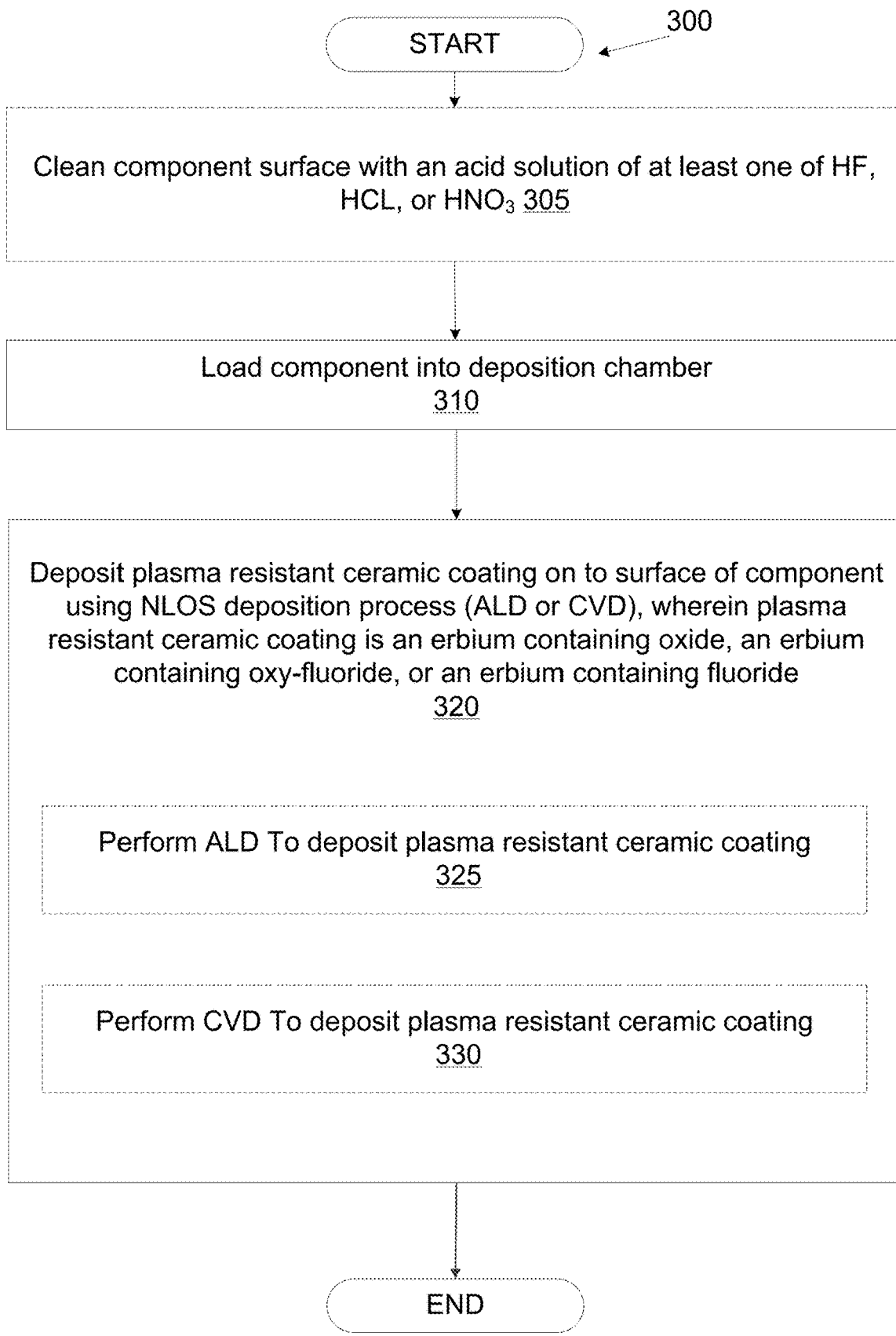
FIG. 3A illustrates a method for creating a ceramic coating using either atomic layer deposition or chemical vapor deposition, in accordance with embodiments.

FIG. 3A illustrates a method 300 for forming a plasma resistant ceramic coating comprising erbium on an article such as a process chamber component according to embodiments. Method 300 may be used to coat articles having aspect ratios of about 10:1 to about 200:1 (e.g., aspect ratios of 20:1, 50:1, 100:1, 150:1, and so on). The method may optionally begin by selecting a composition for the plasma resistant ceramic coating. The composition selection and method of forming may be performed by the same entity or by multiple entities.

The method may optionally include, at block 305, cleaning the article with an acid solution. In one embodiment, the article is bathed in a bath of the acid solution. The acid solution may be a hydrofluoric acid (HF) solution, a hydrochloric acid (HCl) solution, a nitric acid ($HNO_3$) solution, or combination thereof in embodiments. The acid solution may remove surface contaminants from the article and/or may remove an oxide from the surface of the article. Cleaning the article with the acid solution may improve a quality of a coating deposited using ALD. In one embodiment, an acid solution containing approximately 0.1-5.0 vol % HF is used to clean chamber components made of quartz. In one embodiment, an acid solution containing approximately 0.1-20 vol % HCl is used to clean articles made of $Al_2O_3$. In one embodiment, an acid solution containing approximately 5-15 vol % $HNO_3$ is used to clean articles made of aluminum and other metals.

At block 310, the article is loaded into a deposition chamber. If ALD is to be performed, then the article is loaded into an ALD deposition chamber. If CVD is to be performed, then the article is loaded into a CVD deposition chamber.

Pursuant to block 320, the method comprises depositing an erbium based plasma resistant ceramic coating onto a surface of the article using either ALD or CVD. In one embodiment, at block 325 ALD is performed to deposit an erbium based plasma resistant ceramic coating. In one embodiment, at block 330 CVD is performed to deposit the erbium based plasma resistant ceramic coating. ALD and CVD are very conformal processes as performed in embodiments, which may cause the surface roughness of the erbium based plasma resistant ceramic coating to match a surface roughness of an underlying surface of the article that is coated. The erbium based plasma resistant ceramic coating may have a thickness that is a monolayer thick (e.g., about 0.1-2 nm) to a thickness of about 100 nm in some embodiments. In other embodiments, the erbium based plasma resistant ceramic coating may have a thickness of about 100 nm to about 1 micron. The erbium based plasma resistant ceramic coating may have a porosity of 0% (or approximately 0%) and a thickness variation of about +/−5% or less.

The erbium based plasma resistant ceramic coating is an erbium containing oxide, an erbium containing fluoride, or an erbium containing oxy-fluoride. Erbium based materials are used to form the plasma resistant ceramic coating in embodiments because Erbium based oxides, fluorides and oxy-fluorides generally have high stability, high hardness, and superior erosion resistant properties. For example, $Er_2O_3$ has a Gibbs formation free energy of −1808.70 kJ/mol at 298 K, which indicates that $Er_2O_3$ is very stable and will have low reaction rates with oxygen during processing. Additionally, $Er_2O_3$ has a monoclinic cubic structure at temperatures of below about 2300° C., which contributes to a high hardness for $Er_2O_3$ of 9.75+/−3.38 GPa and a fracture toughness (ability to withstand fracturing) of about 2.2-4.0 MPa·m$^{1/2}$. An $Er_2O_3$ plasma resistant ceramic coating deposited in accordance with embodiments herein may also have a low erosion rate to many plasma and chemistry environments, such as an erosion rate of about 0.0187 μm/hr when exposed to a $CCl_4/CHF_3$ plasma chemistry at a bias of 2000 Watts.

Examples of erbium containing compounds that the plasma resistant ceramic coating may be formed of include $Er_2O_3$, $ErF_3$, $Er_xO_yF_z$, $Er_xAl_yO_z$ (e.g., $Er_3Al_5O_{12}$), $Er_xZr_yO_z$, $Er_aZr_xAl_yO_z$, $Y_xEr_yO_z$, $Y_xEr_yF_z$, $Y_wEr_xO_yF_z$, and $Er_aY_xZr_yO_z$ (e.g., a single phase solid solution of $Y_2O_3$, $ZrO_2$ and $Er_2O_3$). The erbium content in the plasma resistant ceramic coating may range from about 0.1 at. % to close to 100 at. %. For erbium containing oxides, the erbium content may range from about 0.1 at. % to close to 100 at. % and the oxygen content may range from about 0.1 at. % to close to 100 at. %. For erbium containing fluorides, the erbium content may range from about 0.1 at. % to close to 100 at. % and the fluorine content may range from about 0.1 at. % to close to 100 at. %. For erbium containing oxy-fluorides, the erbium content may range from about 0.1 at. % to close to 100 at. %, the oxygen content may range from about 0.1 at. % to close to 100 at. %, and the fluorine content may range from about 0.1 at. % to close to 100 at. %.

Advantageously, $Y_2O_3$ and $Er_2O_3$ are miscible. A single phase solid solution can be formed for any combination of $Y_2O_3$ and $Er_2O_3$. For example, a mixture of just over 0 mol % $Y_2O_3$ and just under 100 mol % $Er_2O_3$ may be combined to form a plasma resistant ceramic coating that is a single phase solid solution. Additionally, a mixture of just over 0 mol % $E_2O_3$ and just under 100 mol % $Y_2O_3$ may be combined to form a plasma resistant ceramic coating that is a single phase solid solution. Plasma resistant ceramic coatings of $Y_xEr_yO_z$ may contain between over 0 mol % to under 100 mol % $Y_2O_3$ and over 0 mol % to under 100 mol % $Er_2O_3$. Some notable examples include 1-10 mol % $Y_2O_3$ and 90-99 mol % $Er_2O_3$, 11-20 mol % $Y_2O_3$ and 80-89 mol % $Er_2O_3$, 21-30 mol % $Y_2O_3$ and 70-79 mol % $Er_2O_3$, 31-40 mol % $Y_2O_3$ and 60-69 mol % $Er_2O_3$, 41-50 mol % $Y_2O_3$ and 50-59 mol % $Er_2O_3$, 51-60 mol % $Y_2O_3$ and 40-49 mol % $Er_2O_3$, 61-70 mol % $Y_2O_3$ and 30-39 mol % $Er_2O_3$, 71-80 mol % $Y_2O_3$ and 20-29 mol % $Er_2O_3$, 81-90 mol % $Y_2O_3$ and 10-19 mol % $Er_2O_3$, and 1-10 mol % $Er_2O_3$ and 90-99 mol % $Y_2O_3$. The single phase solid solution of $Y_xEr_yO_z$ may have a monoclinic cubic state at temperatures below about 2330° C.

Advantageously, $ZrO_2$ may be combined with $Y_2O_3$ and $Er_2O_3$ to form a single phase solid solution containing a mixture of the $ZrO_2$, $Y_2O_3$ and $Er_2O_3$ (e.g., $Er_aY_xZr_yO_z$). The solid solution of $Er_aY_xZr_yO_z$ may have a cubic, hexagonal, tetragonal and/or cubic fluorite structure. The solid solution of $Er_aY_xZr_yO_z$ may contain over 0 mol % to 60 mol % $ZrO_2$, over 0 mol % to 99 mol % $Er_2O_3$, and over 0 mol % to 99 mol % $Y_2O_3$. Some notable amounts of $ZrO_2$ that may be used include 2 mol %, 5 mol %, 10 mol %, 15 mol %, 20 mol %, 30 mol %, 50 mol % and 60 mol %. Some notable amounts of $Er_2O_3$ and/or $Y_2O_3$ that may be used include 10 mol %, 20 mol %, 30 mol %, 40 mol %, 50 mol %, 60 mol %, 70 mol %, 80 mol %, and 90 mol %.

Plasma resistant ceramic coatings of $Er_aZr_xAl_yO_z$ may contain over 0% to 60 mol % $ZrO_2$, over 0 mol % to 99 mol % $Er_2O_3$, and over 0 mol % to 60 mol % $Al_2O_3$. Some notable amounts of $ZrO_2$ that may be used include 2 mol %, 5 mol %, 10 mol %, 15 mol %, 20 mol %, 30 mol %, 50 mol % and 60 mol %. Some notable amounts of $Er_2O_3$ that may be used include 10 mol %, 20 mol %, 30 mol %, 40 mol %, 50 mol %, 60 mol %, 70 mol %, 80 mol %, and 90 mol %. Some notable amounts of $Al_2O_3$ that may be used include 2 mol %, 5 mol %, 10 mol %, 20 mol %, 30 mol %, 40 mol %, 50 mol % and 60 mol %. In one example, the plasma resistant ceramic coating of $Er_aZr_xAl_yO_z$ contains 42 mol % $Y_2O_3$, 40 mol % $ZrO_2$ and 18 mol % $Er_2O_3$ and has a lamellar structure. In another example, the plasma resistant ceramic coating of $Er_aZr_xAl_yO_z$ contains 63 mol % $Y_2O_3$, 10 mol % $ZrO_2$ and 27 mol % $Er_2O_3$ and has a lamellar structure.

Plasma resistant ceramic coatings of $Y_xEr_yF_z$ may contain a mixture of just over 0 mol % $YF_3$ and just under 100 mol % $ErF_3$. Additionally, a mixture of just over 0 mol % $ErF_3$ and just under 100 mol % $YF_3$ may be combined to form a plasma resistant ceramic coating. Plasma resistant ceramic coatings of $Y_xEr_yF_z$ may contain between over 0 mol % to under 100 mol % $YF_3$ and over 0 mol % to under 100 mol % $ErF_3$. Some notable examples include 1-10 mol % $YF_3$ and 90-99 mol % $ErF_3$, 11-20 mol % $YF_3$ and 80-89 mol % $ErF_3$, 21-30 mol % $YF_3$ and 70-79 mol % $ErF_3$, 31-40 mol % $YF_3$ and 60-69 mol % $ErF_3$, 41-50 mol % $YF_3$ and 50-59 mol % $ErF_3$, 51-60 mol % $YF_3$ and 40-49 mol % $ErF_3$, 61-70 mol % $YF_3$ and 30-39 mol % $ErF_3$, 71-80 mol % $YF_3$ and 20-29 mol % $ErF_3$, 81-90 mol % $YF_3$ and 10-19 mol % $ErF_3$, and 1-10 mol % $ErF_3$ and 90-99 mol % $YF_3$.

Three of more of $Y_2O_3$, $Er_2O_3$, $YF_3$ and $ErF_3$ may be combined to form a solid solution of $Y_wEr_xO_yF_z$. The solid solution of $Y_wEr_xO_yF_z$ may contain over 0 mol % to less than 100 mol % $Y_2O_3$, over 0 mol % to less than 100 mol % $Er_2O_3$, over 0 mol % to less than 100 mol % $YF_3$ and/or over 0 mol % to less than 100 mol % ErF3. Some notable amounts of $Er_2O_3$, $Y_2O_3$, $YF_3$ and/or $ErF_3$ that may be used include 10 mol %, 20 mol %, 30 mol %, 40 mol %, 50 mol %, 60 mol %, 70 mol %, 80 mol %, and 90 mol %.

In embodiments, the erbium based plasma resistant ceramic coating of $Er_2O_3$, $ErF_3$, $Er_xO_yF_z$, $Er_xAl_yO_z$ (e.g., $Er_3Al_5O_{12}$), $Er_xZr_yO_z$, $Er_aZr_xAl_yO_z$, $Y_xEr_yO_z$, $Y_xEr_yF_z$, $Y_wEr_xO_yF_z$, or $Er_aY_xZr_yO_z$ has a low outgassing rate, a dielectric breakdown voltage on the order of about 200 V/μm, and a hermiticity (leak rate) of less than about $10^{-9}$ Torr.

Figure 3B:
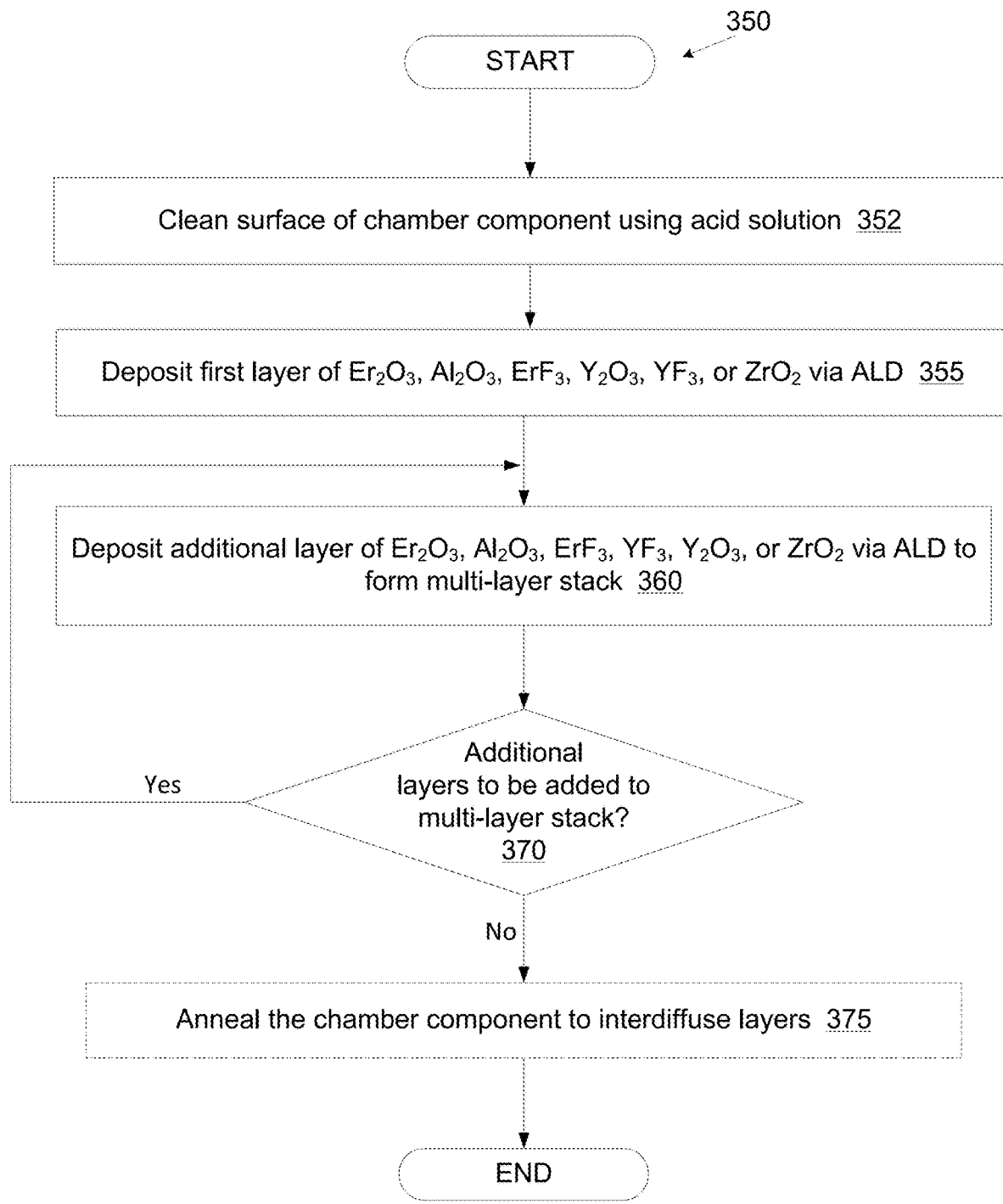
FIG. 3B illustrates a method for creating a ceramic coating using atomic layer deposition, in accordance with one embodiment.

FIG. 3B illustrates a method 350 for forming a erbium based plasma resistant ceramic coating on an article such as a process chamber component according to an embodiment. The method may optionally begin by selecting a composition for the plasma resistant ceramic coating. The composition selection and method of forming may be performed by the same entity or by multiple entities.

At block 352 of method 350, a surface of the article (e.g., of the process chamber component) is cleaned using an acid solution. The acid solution may be any of the acid solutions described above with reference to block 305 of method 300. The article may then be loaded into an ALD deposition chamber.

Pursuant to block 355, the method comprises depositing a first layer of $Er_2O_3$, $Al_2O_3$, $ErF_3$, $YF_3$, $Y_2O_3$, or $ZrO_2$ onto a surface of an article via ALD. Pursuant to block 360, the method further comprises depositing an additional layer of a second oxide or a second fluoride onto the surface of the article via ALD. The second oxide or fluoride is one of $Er_2O_3$, $Al_2O_3$, $ErF_3$, $Y_2O_3$, or $ZrO_2$. In one embodiment, the additional layer is a different material than first layer.

In some embodiments, pursuant to block 370, the method may further comprise determining whether additional layers are to be added. Determining whether additional layers are to be added and/or how many layers are to be added can be either done in-situ, or prior to initiating the depositions (e.g., in the optional multi-component composition selection process). If additional layers are to be added, the operations of block 360 may be repeated, and an additional layer of $Er_2O_3$, $Al_2O_3$, $ErF_3$, $YF_3$, $Y_2O_3$, or $ZrO_2$ may be deposited by ALD. The additional layer may be a same material as the first layer or one or more previous additional layers. Alternatively, the additional layer may be a different material from the first layer and previous additional layers. If no more additional layers are to be added, the method may proceed to block 375.

In some embodiments, when the first layer or any of the additional layers comprises yttrium oxide, at least one yttrium oxide precursor may be selected from tris(N,N-bis (trimethylsilyl)amide)yttrium (III) or yttrium (III)butoxide for the ALD. In some embodiments, when the first layer or any of the additional layers comprises yttrium fluoride, at least one yttrium fluoride precursor may be selected from the combination of $Y(thd)_3$, where thd=2,2,6,6-tetramethyl-3,5-heptanedionatom, and $TiF_4$, $TaF_5$, or $NH_4F$, for the ALD.

In some embodiments, when the first layer or any of the additional layers comprises aluminum oxide, at least one aluminum oxide precursor may be selected from diethylaluminum ethoxide, tris(ethylmethylamido)aluminum, aluminum sec-butoxide, aluminum tribromide, aluminum trichloride, triethylaluminum, triisobutylaluminum, trimethylaluminum, or tris(diethylamido)aluminum for ALD. In some embodiments, when the first layer or any of the additional layers comprises zirconium oxide, at least one zirconium oxide precursor may be selected from zirconium (IV) bromide, zirconium (IV) chloride, zirconium (IV) tert-butoxide, tetrakis(diethylamido)zirconium (IV), tetrakis(dimethylamido)zirconium (IV), or tetrakis(ethylmethylamido) zirconium (IV) for ALD.

In some embodiments, when the first layer or any of the additional layers comprises erbium oxide, at least one erbium oxide precursor may be selected from tris-methylcyclopentadienyl erbium(III) ($Er(MeCp)_3$), erbium boranamide $(Er(BA)_3)$ $Er(TMHD)_3$, erbium(III) tris(2,2,6,6-tetramethyl-3,5-heptanedionate), or tris (butylcyclopentadienyl)erbium(III) for ALD. In some embodiments, when the first layer or any of the additional layers comprises erbium oxide, tris(2,2,6,6-tetramethyl-3,5-heptanedionato) erbium (Er(thd)3) and ozone are used as the precursors to form $Er_2O_3$. In some embodiments, when the first layer or any of the additional layers comprises erbium oxide, Er(CpMe)3 and water are used as the precursors to form $Er_2O_3$. In some embodiments, when the first layer or any of the additional layers comprises erbium oxide, Er(thd)3 and O-radicals are used as the precursors to form $Er_2O_3$. In some embodiments, when the first layer or any of the additional layers comprises erbium oxide, Er(PrCp)3, Er(CpMe)2 and/or Er(BuCp)3 are used with either ozone or water as the precursors to form $Er_2O_3$.

At least one of the listed precursors or any other suitable precursors may be used each time a $Er_2O_3$, $Al_2O_3$, $ErF_3$, $Y_2O_3$, $YF_3$, or $ZrO_2$ layer is grown using ALD, regardless of whether it is the first, second, or Nth film layer, where the Nth film layer would represent a finite number of film layers grown on the surface of the article and selected based on targeted protective coating thickness and properties.

At block 375, the article (e.g., the chamber component) and all of the layers of the plasma resistant ceramic coating on the chamber component are annealed. In some embodiments, the annealing may result in a multi-component composition comprising an interdiffused solid state phase of some or all film layers deposited onto the surface of the article. Annealing may be performed at a temperature ranging from about 300° C. to about 1800° C., from about 300° C. to about 1500° C., from about 300° C. to about 1000° C., or from about 300° C. to about 500° C. The annealing temperature may be selected based on the material of construction of the article, surface, and film layers so as to maintain their integrity and refrain from deforming, decomposing, or melting any or all of these components.

Figure 4A:
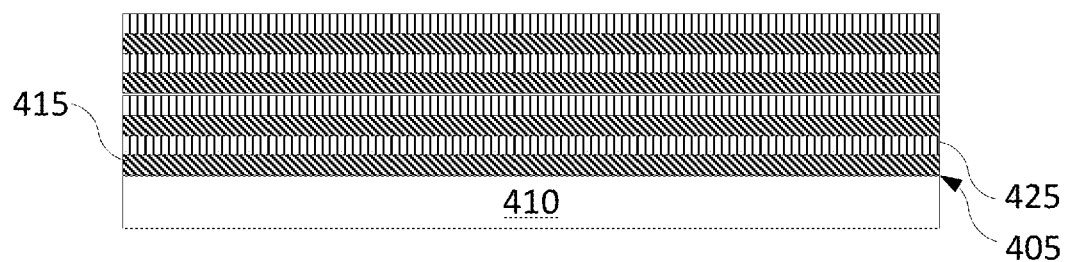
FIGS. 4A-4D depict variations of a multi-component coating composition according to different embodiments.

FIGS. 4A-4D depict variations of a erbium based plasma resistant ceramic coating according to different embodiments. FIG. 4A illustrates an erbium based plasma resistant ceramic coating having a multi-component composition for a surface 405 of an article 410 according to an embodiment. Surface 405 may be the surface of various articles 410. For example, articles 410 may include various semiconductor process chamber components including but not limited to substrate support assembly, an electrostatic chuck (ESC), a ring (e.g., a process kit ring or single ring), a chamber wall, a base, a gas distribution plate, gas lines, a showerhead, a nozzle, a lid, a liner, a liner kit, a shield, a plasma screen, a flow equalizer, a cooling base, a chamber viewport, a chamber lid, and so on. The semiconductor process chamber component may be made from a metal (such as aluminum, stainless steel), a ceramic, a metal-ceramic composite, a polymer, a polymer ceramic composite, or other suitable materials, and may further comprise materials such as AlN, Si, SiC, $Al_2O_3$, $SiO_2$, and so on.

In FIG. 4A, the multi component coating composition comprises at least one first film layer 415 of an erbium oxide or an erbium fluoride coated onto surface 405 of article 410 using an ALD or CVD process and at least one second film layer 425 of an additional oxide or an additional fluoride coated onto surface 405 of article 410 using an ALD process.

FIG. 4A illustrates an embodiment where the erbium based plasma resistant ceramic coating comprises a stack of alternating layers of the first layer 415 and the second layer 425, where the layers are intact and not interdiffused, where there is an equal number of each of the layers (four 415 layers and four 425 layers), and where all layers are of equal uniform thickness. In some embodiments, the first film layer is deposited prior to the deposition of the second film layer, and the second film layer is deposited over the first film layer. In some embodiments, the order may be reversed. Alternatively, the layers may have different thicknesses.

Figure 4B:
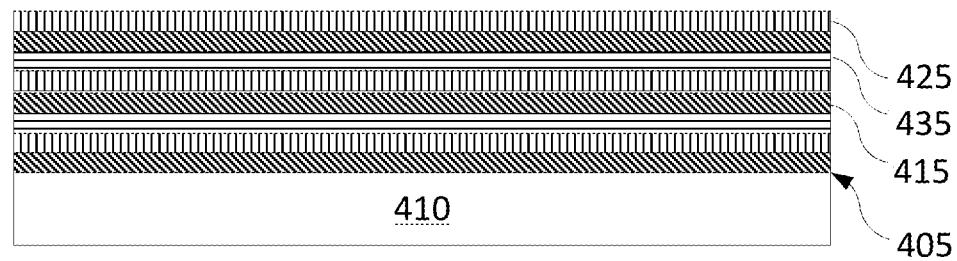

FIG. 4B illustrates an embodiment where the erbium based plasma ceramic coating has a multi-component coating composition. The erbium based plasma resistant ceramic coating is deposited on surface 405 of article 410 (e.g., a semiconductor process chamber component as described above) and comprises a stack of alternating layers of the first layer 415, second layer 425, and at least one additional layer 435. The layers are intact and deposited and/or grown at a predetermined order and with a uniform equal thickness. However, the number of layers may not be equal and certain layers may be more prevalent than others (e.g., three 415 layers, three 425 layers, two 435 layers).

In some embodiments, one or more of the layers is a monolayer or a thin layer having a uniform thickness ranging from about 0.1 nanometer to about 100 nanometer. One or more of the layers may be thick layers having a uniform thickness ranging from about 100 nanometer to about 1 micrometer.

Figure 4C:
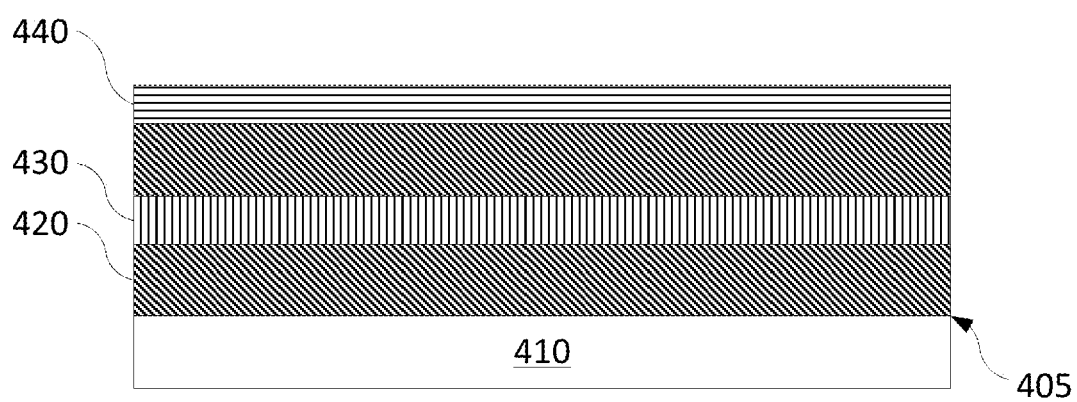

FIG. 4C illustrates an embodiment where the erbium based plasma resistant ceramic coating is a multi-component coating. The erbium based plasma resistant ceramic coating is deposited on surface 405 of article 410 and comprises a stack of intact uniform film layers without a fixed order or fixed thickness. The multi-component coating comprises a first thick layer 420 having a first thickness, a second thick layer 430 having a second thickness different from the first thickness, and at least one additional thick layer 440 having a third thickness different from the first and the second thickness. Certain layers may be more prevalent than others so as to achieve certain properties (such as erosion/corrosion resistance) for the multi-component coating (two 420 layers, one 430 layer, one 440 layers).

In some embodiments, the various film layers illustrated in FIGS. 4A through 4C may have the same composition. In other embodiments, the compositions of the layers may be different. In some embodiments, the various film layers may have similar properties such as thickness, porosity, plasma resistance, CTE. In other embodiments, each film layer may have different properties. It is to be understood that although FIGS. 4A-4C depict a certain number of film layers, the figures are not intended to be limiting, and more or fewer film layers may be deposited onto the surface in certain embodiments. In some embodiments, the entire surface of the article may be coated. In other embodiments, at least a portion of the article's surface may be coated.

Figure 4D:
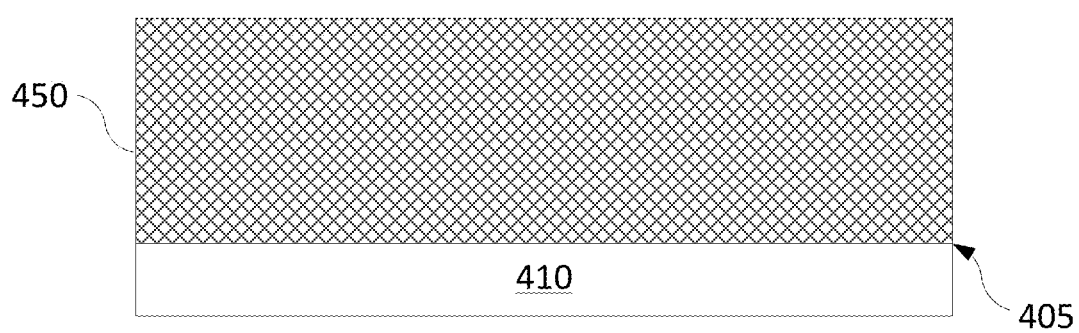

FIG. 4D illustrates an embodiment where the erbium based plasma resistant ceramic coating has a multi-component coating composition 450. The erbium based plasma resistant ceramic coating is deposited on surface 405 of article 410 and comprises an interdiffused solid state phase of multiple layers. In some embodiments, the erbium based plasma resistant ceramic coating, whether comprising intact layers or an interdiffused solid state phase, is selected from the group consisting of $Er_2O_3$, $ErF_3$, $Er_xO_yF_z$, $Er_xAl_yO_z$ (e.g., $Er_3Al_5O_{12}$), $Er_xZr_yO_z$, $Er_aZr_xAl_yO_z$, $Y_xEr_yO_z$, $Y_xEr_yF_z$, $Y_wEr_xO_yF_z$, and $Er_aY_xZr_yO_z$ (e.g., a single phase solid solution of $Y_2O_3$, $ZrO_2$ and $Er_2O_3$). Some example processes for creating these various multi-component coating compositions are illustrated in the examples below.

Figure 5A:
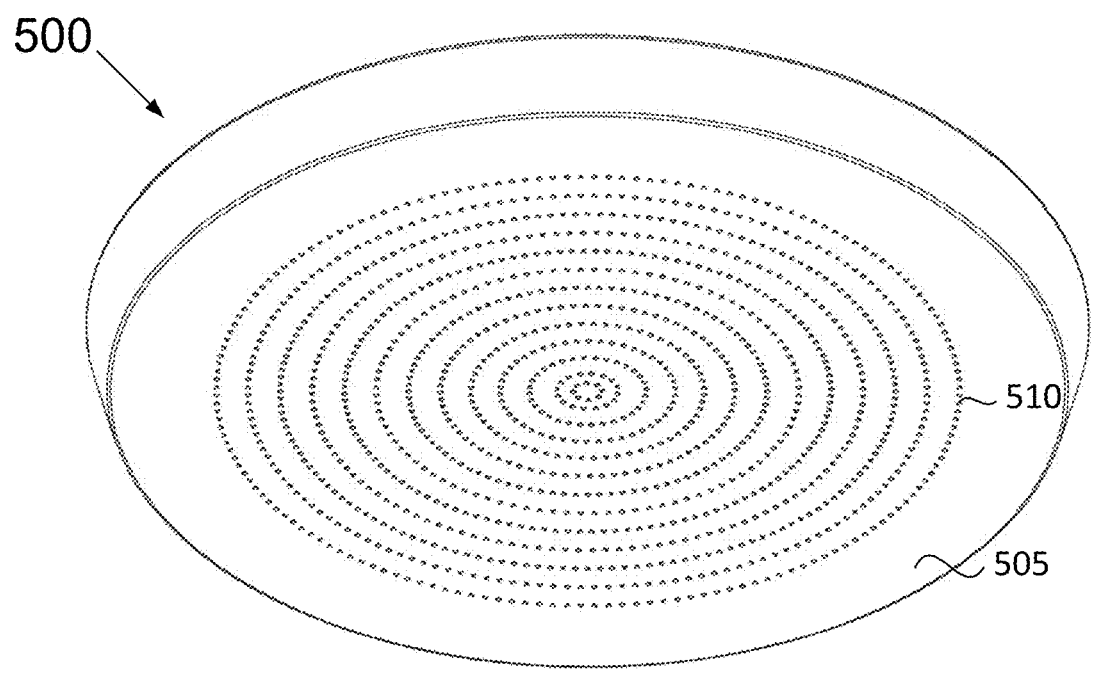
FIG. 5A depicts a chamber component (showerhead) according to an embodiment.

FIG. 5A illustrates a bottom view of a showerhead 500. The showerhead example provided below is just an exemplary chamber component whose performance may be improved by the use of the erbium based plasma resistant ceramic coating as set forth in embodiments herein. It is to be understood that the performance of other chamber components may also be improved when coated with the erbium based plasma resistant ceramic coating disclosed herein. The showerhead 500, as depicted here, was chosen as an illustration of a semiconductor process chamber component having a surface with complex geometry and holes with large aspect ratios.

The complex geometry of lower surface 505 may receive a erbium based plasma resistant ceramic coating according to embodiments herein. Lower surface 505 of showerhead 500 defines gas conduits 510 arranged in evenly distributed concentric rings. In other embodiments, gas conduits 510 may be configured in alternative geometric configurations and may have as many or as few gas conduits as needed depending on the type of reactor and/or process utilized. The erbium based plasma resistant ceramic coating is grown or deposited on surface 505 and in gas conduit holes 510 using the ALD technique or CVD technique which enables a conformal coating of relatively uniform thickness on the surface as well as in the gas conduit holes despite the complex geometry and the large aspect ratios of the holes.

Showerhead 500 may be exposed to corrosive chemistries such as fluorine and may erode due to plasma interaction with the showerhead. The erbium based plasma resistant ceramic coating may reduce such plasma interactions and improve the showerhead's durability. The erbium based plasma resistant ceramic coating deposited with ALD or CVD maintains the relative shape and geometric configuration of the lower surface 505 and of the gas conduits 510 so as to not disturb the functionality of the showerhead. Similarly, when applied to other chamber components, the plasma resistant ceramic coating may maintain the shape and geometric configuration of the surface it is intended to coat so as to not disturb the component's functionality, provide plasma resistance, and improve erosion and/or corrosion resistance throughout the entire surface.

The resistance of the coating material to plasma is measured through "etch rate" (ER), which may have units of micron/hour (μm/hr), throughout the duration of the coated components' operation and exposure to plasma. Measurements may be taken after different processing times. For example, measurements may be taken before processing, after 50 processing hours, after 150 processing hours, after 200 processing hours, and so on. Variations in the composition of the erbium based plasma resistant ceramic coating grown or deposited on the showerhead or on any other process chamber component may result in multiple different plasma resistances or erosion rate values. Additionally, a erbium based plasma resistant ceramic coating with a single composition exposed to various plasmas could have multiple different plasma resistances or erosion rate values. For example, a plasma resistant material may have a first plasma resistance or erosion rate associated with a first type of plasma and a second plasma resistance or erosion rate associated with a second type of plasma.

Figure 5B:
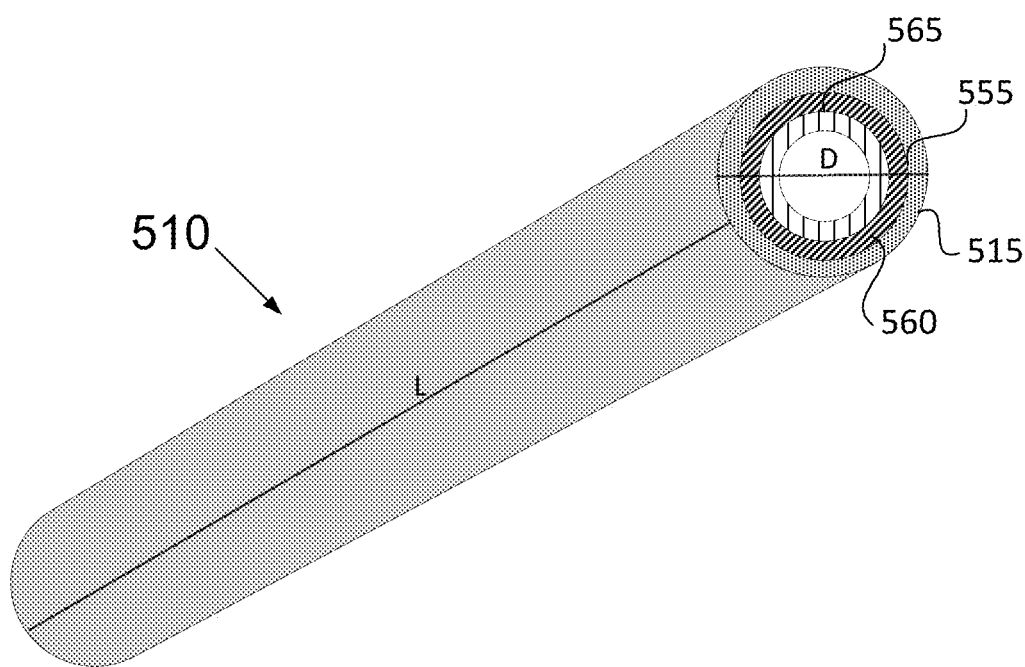
FIG. 5B depicts a blown up view of a gas conduit having a large aspect ratio, wherein an interior of the gas conduit is coated, according to an embodiment.

FIG. 5B depicts a blown up view of a gas conduit 510 having a large aspect ratio coated according to an embodiment. Gas conduit 510 may have a length L and a diameter D. Gas conduit 510 may have a large aspect ratio defined as L:D, wherein the aspect ratio may range from about 50:1 to about 100:1. In some embodiments, the aspect ratio may be lower than 50:1 or greater than 100:1 (e.g., up to 200:1).

Gas conduit 510 may have an interior surface 555 which may be coated with a erbium based plasma resistant ceramic coating. The erbium based plasma resistant ceramic coating may comprise at least one first layer 560 and may optionally comprise a second layer 565 and optionally one or more additional layer (not shown). The first layer 560 may comprise an erbium based oxide, an erbium based fluoride, or an erbium based oxy-fluoride. The first layer 560 may have any of the erbium based material compositions described herein above. The second layer 565 and/or one or more additional layers may each comprise an additional oxide or an additional fluoride (e.g., yttrium oxide, yttrium fluoride, zirconium oxide, aluminum oxide, etc.). In some embodiments, the second layer 565 is another erbium based material, and may have any of the erbium based material compositions described herein above. All layers may be coated using an ALD process or a CVD process. The ALD process and CVD process may grow conformal coating layers of uniform thickness throughout the interior surface of gas conduit 510 despite its large aspect ratio while ensuring that the final multi-component coating may also be thin enough so as to not plug the gas conduits in the showerhead.

In some embodiments, the erbium based plasma resistant ceramic coating may comprise intact layers of at least one first layer, at least one second layer, and optionally at least one additional layer. In an embodiment, the first, second, and any optional additional layers may alternate at a predetermined order. In another embodiment, the first, second, and any optional additional layers may be present in any order. In some embodiments, there may be an equal number of each one of the first, of the second, and of any optional additional layer. In other embodiments, some of the layers may be more prevalent than other layers so as to achieve certain properties for the plasma resistant ceramic coating. Certain properties may be plasma resistance and erosion/corrosion resistance that would improve the durability of the coated semiconductor process chamber component.

In some embodiments, the intact layers may comprise monolayers or thin layers of uniform thickness. Each monolayer or thin layer may have a thickness ranging from about 0.1 nanometers to about 100 nanometers. In other embodiments, the intact layers may comprise thick layers of uniform thickness. Each thick layer may have a thickness ranging from about 100 nanometers to about 1 micrometer. In yet other embodiments, the intact layers may comprise a combination of monolayers, thin layers and/or thick layers.

In other embodiments, the erbium based plasma resistant ceramic coating may comprise an interdiffused solid state phase of at least one first layer, at least one second layer, and optionally at least one additional layer. In an embodiment, an interdiffused solid state phase of the various layers may be obtained through annealing. The composition of the layers, number of layers, frequency of each layer, and thickness of the layers will all contribute to the final properties of the erbium based plasma resistant ceramic coating.

The following examples are set forth to assist in understanding the embodiments described herein and should not be construed as specifically limiting the embodiments described and claimed herein. Such variations, including the substitution of all equivalents now known or later developed, which would be within the purview of those skilled in the art, and changes in formulation or minor changes in experimental design, are to be considered to fall within the scope of the embodiments incorporated herein. These examples may be achieved by performing method 300 or method 350 described above.

Example 1—Forming an $Er_xO_yF_z$ Coating from Erbium Oxide and Erbium Fluoride Layers A first layer may be an erbium oxide monolayer grown using ALD from a precursor or pair of precursors selected from any of the previously mentioned erbium oxide precursors. A second layer may be an erbium fluoride monolayer grown using ALD from an erbium fluoride precursor. One or more additional layers of erbium oxide and/or erbium fluoride may be grown. The resulting coating may comprise $Er_xO_yF_z$ after annealing, where X, Y and Z depend on the ratio of erbium oxide layers to erbium fluoride layers.

Example 2—Forming a $Er_xAl_yO_z$ Coating from Erbium Oxide and Aluminum Oxide Layers A first layer may be an erbium oxide monolayer grown using ALD from one or more of the previously mentioned erbium oxide precursors or other erbium oxide precursors. A second layer may be an aluminum oxide monolayer grown using ALD from any of the previously mentioned aluminum oxide precursors or other aluminum oxide precursors. One or more additional erbium oxide layers and/or aluminum oxide layers may be grown. The resulting coating may comprise $Er_xAl_yO_z$ after annealing, where X, Y and Z depend on the ratio of erbium oxide layers to aluminum oxide layers.

Example 3—Forming a $Er_xZr_yO_z$ Coating from Erbium Oxide and Zirconium Oxide Layers A first layer may be an erbium oxide monolayer grown using ALD from one or more of the previously mentioned erbium oxide precursors or other erbium oxide precursors. A second layer may be a zirconium oxide monolayer grown using ALD from one or more of the previously mentioned zirconium oxide precursors or other zirconium oxide precursors. One or more additional erbium oxide layers and/or zirconium oxide layers may be grown. The resulting coating may comprise $Er_xZr_yO_z$ after annealing, where X, Y and Z depend on the ratio of erbium oxide layers to zirconium oxide layers.

Example 4—Forming a $Er_aZr_xAl_yO_z$ Coating from Yttrium Oxide, Zirconium Oxide, and Aluminum Oxide Layers A first layer may be an erbium oxide monolayer grown using ALD from one or more of the previously mentioned erbium oxide precursors or other erbium oxide precursors. A second layer may be a zirconium oxide monolayer grown using ALD from one or more of the previously mentioned zirconium oxide precursors or other zirconium oxide precursors. A third layer may be an aluminum oxide monolayer grown using ALD from any of the previously mentioned aluminum oxide precursors or other aluminum oxide precursors. One or more additional layers of erbium oxide, zirconium oxide and/or aluminum oxide may be grown. The resulting coating may comprise $Er_aZr_xAl_yO_z$ after annealing, where A, X, Y, and Z depend on the number and ratio of erbium oxide layers, aluminum oxide layers and zirconium oxide layers.

Example 5—Forming a $Y_xEr_yO_z$ Coating from Yttrium Oxide and Erbium Oxide Layers A first layer may be an erbium oxide monolayer grown using ALD from one or more of the previously mentioned erbium oxide precursors or other erbium oxide precursors. A second layer may be a yttrium oxide monolayer grown using ALD from one or more of the previously mentioned yttrium oxide precursors or other yttrium oxide precursors. One or more additional layers of erbium oxide and/or yttrium oxide may be grown. The resulting coating may comprise $Y_xEr_yO_z$ after annealing, where X, Y, and Z depend on the ratio of erbium oxide layers to yttrium oxide layers.

Example 6—Forming a $Er_aY_xZr_yO_z$ Coating from Yttrium Oxide, Erbium Oxide and Zirconium Oxide Layers A first layer may be an erbium oxide monolayer grown using ALD from one or more of the previously mentioned erbium oxide precursors or other erbium oxide precursors. A second layer may be a yttrium oxide monolayer grown using ALD from one or more of the previously mentioned yttrium oxide precursors or other yttrium oxide precursors. A third layer may be a zirconium oxide monolayer grown using ALD from one or more of the previously mentioned zirconium oxide precursors or other zirconium oxide precursors. One or more additional layers of erbium oxide, yttrium oxide and/or zirconium oxide may be grown. The resulting coating may comprise $Er_aY_xZr_yO_z$ after annealing, where A, X, Y, and Z depend on the number and ratio of erbium oxide layers, yttrium oxide layers and zirconium oxide layers. The resulting erbium based plasma resistant ceramic coating may therefore be a single phase solid solution that contains a mixture of $Y_2O_3$, $ZrO_2$ and $Er_2O_3$.

Figure 6:
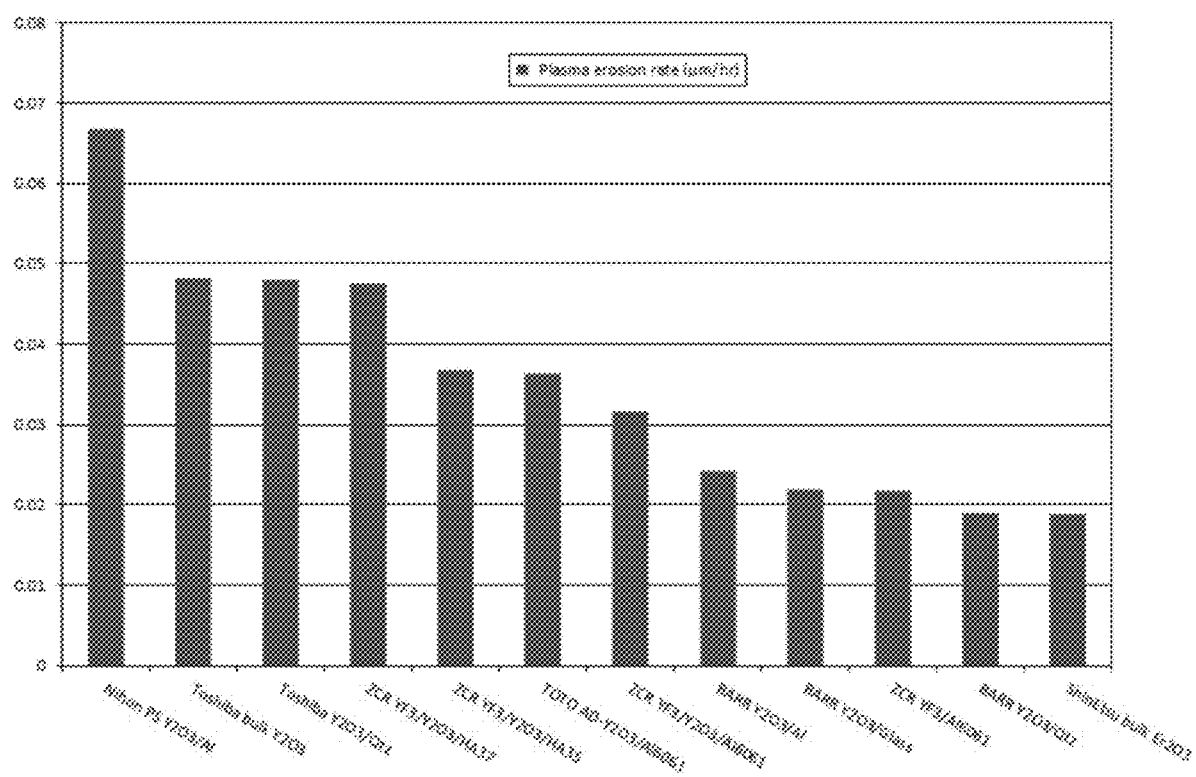
FIG. 6 is a chart comparing plasma etch erosion rates in microns per hour for different ceramics.

FIG. 6 is a chart comparing plasma etch erosion rates in microns per hour for different ceramics. As shown, the erosion rate of bulk $Er_2O_3$ is less than 0.02 μm/hr when exposed to a plasma etch chemistry of $CCl_4/CHF_3$ at a bias of 2000 Watts. The etch rate of bulk $Er_2O_3$ is lower than the etch rates of $Y_2O_3$ and $YF_3$ as shown. ALD and CVD deposited $Er_2O_3$ is denser than bulk $Er_2O_3$ (e.g., has a lower porosity), and also have a lower etch rate than bulk $Er_2O_3$.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:
1. An article comprising:
   a surface; and
   a plasma resistant ceramic coating on the surface of the article, wherein the plasma resistant ceramic coating has an approximately zero porosity and has a uniform thickness with a thickness variation of less than +/−5%, and wherein the plasma resistant ceramic coating is selected from a group consisting of:
   an erbium containing fluoride of $Y_xEr_yF_z$, where x, y and z are selected such that the erbium containing fluoride of $Y_xEr_yF_z$ contains over 0 mol % to under 100 mol % $YF_3$ and over 0 mol % to under 100 mol % $ErF_3$, and
   an erbium containing oxy-fluoride of $Y_wEr_xO_yF_z$, where w, x, y and z are selected such that the erbium containing oxy-fluoride of $Y_wEr_xO_yF_z$ contains over 0 mol % to under 100 mol % of two or more of $Y_2O_3$, $YF_3$, $Er_2O_3$ and $ErF_3$,
   wherein the article comprises a portion having an aspect ratio between 10:1 and 200:1, and wherein the surface of the article that is coated with the plasma resistant ceramic coating comprises the portion of the article.

2. The article of claim 1, wherein the article is a chamber component selected from a group consisting of a shower head, a diffuser, a nozzle, and a gas line.

3. The article of claim 1, wherein the article comprises a conduit, wherein the surface of the article onto which the plasma resistant ceramic coating is deposited comprises an internal surface of the conduit that has an aspect ratio between 50:1 and 200:1.

4. The article of claim 1, wherein the plasma resistant coating has a thickness of 2 nm to 1 micron.

5. A chamber component, comprising:
a portion having an aspect ratio between 10:1 and 200:1; and
a plasma resistant ceramic coating on a surface of the portion the chamber component, wherein the plasma resistant ceramic coating has an approximately zero porosity and has a uniform thickness with a thickness variation of less than +/−5%, and wherein the plasma resistant ceramic coating comprises a multi-layer stack comprising:
a first layer consisting essentially of $Er_2O_3$ or $ErF_3$; and
a second layer consisting of a different material than the first layer, wherein the second layer consists essentially of $Er_2O_3$, $Al_2O_3$, $ErF_3$, $Y_2O_3$, $YF_3$, or $ZrO_2$.

6. The chamber component of claim 5, wherein the chamber component is selected from a group consisting of a shower head, a diffuser, a nozzle, and a gas line.

7. The chamber component of claim 5, wherein the aspect ratio is between 50:1 and 200:1.

8. The chamber component of claim 7, wherein the portion having the aspect ratio is a conduit.

9. The chamber component of claim 5, wherein the first layer consists essentially of $Er_2O_3$ and the second layer consists essentially of $YF_3$.

10. The chamber component of claim 5, wherein the plasma resistant ceramic coating further comprises one or more additional layers each consisting essentially of one of $Er_2O_3$, $Al_2O_3$, $ErF_3$, $Y_2O_3$ or $YF_3$.

11. The chamber component of claim 5, wherein the first layer consists essentially of $Er_2O_3$ and the second layer consists essentially of $Al_2O_3$.

12. The chamber component of claim 5, wherein the first layer consists essentially of $Er_2O_3$ and the second layer consists essentially of $Y_2O_3$.

13. The chamber component of claim 5, wherein the first layer consists essentially of $Er_2O_3$ and the second layer consists essentially of $ErF_3$.

14. The chamber component of claim 5, wherein the first layer consists essentially of $ErF_3$ and the second layer consists essentially of $YF_3$.

15. The chamber component of claim 5, wherein the first layer consists essentially of $Er_2O_3$ and the second layer consists essentially of $ZrO_2$.

16. The chamber component of claim 5, wherein the first layer consists essentially of $Er_2O_3$ and the second layer consists essentially of $Y_2O_3$, the multi-layer stack further comprising:
a third layer consisting essentially of $ZrO_2$ or $Al_2O_3$.

17. The chamber component of claim 5, wherein the first layer and the second layer each has a thickness of 0.1-100 nm.

18. An article comprising:
a surface; and
a plasma resistant ceramic coating on the surface of the article, wherein the plasma resistant ceramic coating has an approximately zero porosity and has a uniform thickness with a thickness variation of less than +/−5%, and wherein the plasma resistant ceramic coating is an interdiffused mixture of a plurality of alternating layers, the plurality of alternating layers comprising:
a first plurality of layers consisting essentially of $Er_2O_3$ or $ErF_3$; and
a second plurality of layers consisting of a different material than the first layer, wherein the second layer consists essentially of $Er_2O_3$, $Al_2O_3$, $ErF_3$, $Y_2O_3$, $YF_3$, or $ZrO_2$,
wherein the article comprises a portion having an aspect ratio between 10:1 and 200:1, and wherein the surface of the article that is coated with the plasma resistant ceramic coating comprises the portion of the article.

* * * * *